US007212460B1

(12) United States Patent
Jung et al.

(10) Patent No.: US 7,212,460 B1
(45) Date of Patent: May 1, 2007

(54) LINE AMPLIFIER TO SUPPLEMENT LINE DRIVER IN AN INTEGRATED CIRCUIT

(75) Inventors: Chulmin Jung, Boise, ID (US); George Raad, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/294,729

(22) Filed: Dec. 5, 2005

(51) Int. Cl.
*G11C 7/00* (2006.01)
*G11C 8/00* (2006.01)

(52) U.S. Cl. .................. 365/207; 365/208; 365/189.05
(58) Field of Classification Search ................ 365/207, 365/208, 226, 189.05
See application file for complete search history.

(56) References Cited

U.S. PATENT DOCUMENTS

| 5,726,944 A * | 3/1998 | Pelley et al. | 365/226 |
| 6,104,653 A * | 8/2000 | Proebsting | 365/203 |
| 6,462,584 B1 * | 10/2002 | Proebsting | 327/52 |
| 7,058,187 B2 * | 6/2006 | Ohta | 381/98 |

\* cited by examiner

*Primary Examiner*—Son Dinh
(74) *Attorney, Agent, or Firm*—Wong, Cabello, Lutsch, Rutherford & Brucculeri, LLP

(57) ABSTRACT

A method and circuitry for boosting a driven signal along a circuit line so as to reduce RC delays is disclosed. In one embodiment, the circuitry includes a line amplifier positioned at a distance from the circuitry that drives signals onto the line, for example, across a memory array. The line amplifier detects the driven signal on the line at early stages, and even before the signal reaches its full potential, the amplifier amplifies that signal and drives it back to the line to help boost the detected signal. In a preferred embodiment, the amplifier comprises a differential amplifier capable of boosting one of two input signal lines. In an alternative embodiment, the amplifier output may additionally input to a feedback loop, which loop ultimately drives a pull-up transistor to boost the detected signal and passes it back to the line to even further assist the differential amplifier in boosting. Use of the disclosed circuitry benefits, as one example, the boosting of a DRAM column select line that passes a long distance through the memory array.

51 Claims, 6 Drawing Sheets

LINE AMPLIFIER TO SUPPLEMENT LINE DRIVER IN AN INTEGRATED CIRCUIT

FIELD OF THE INVENTION

Embodiments of this invention relate to circuitry useable in an integrated circuit such as a Dynamic Random Access Memory (DRAM), and specifically to an amplifier to supplement propagation of a column select line or other signal line needing to be driven a long distance across an integrated circuit, such as across a memory array.

BACKGROUND

DRAM integrated circuit memories are well known, and today DRAMs with capacities of 4 gigabits (4 Gb) are on the verge of being ready for production in reliable quantities. Obviously, in such integrated circuits, circuitry layout space is at a premium, as more and more devices (transistors, memory cells, etc.) are being packed into essentially-equivalent integrated circuit areas with each new DRAM generation. Such tight spacing constraints can cause, among other problems, higher coupling noise between adjacent lines on the integrated circuit.

A result of this progression is that signals are now being required to transgress long distances over the expanse of the integrated circuit. For example, in FIG. 1A, the layout of an exemplary 4 Gb DRAM 10 is shown. As it typical, the DRAM comprises bond pads 16, which normally run down the middle of the device as shown, for routing signals between the DRAM 10 and a suitable package for the DRAM (not shown). In this exemplary DRAM 10, the portion of the DRAM containing the memory cells is divided into eight banks 12, with each bank comprising four arrays 14a–14d.

As one skilled in the art well understands, to address a particular cell in the DRAM, or group of cells together in unison (e.g., if the DRAM is greater than a ×1 device), an address needs to be input to the DRAM 10. Certain address lines (Ax) are generally designated as row address lines, while others are designated as column address lines. The address lines must be decoded so that eventually a limited subset of columns and rows in the array are activated to read/write the cells at their intersections.

Ultimately, activation of the columns and rows occurs under the control of column (bit) and row (word) line driver circuitry in the DRAM, which receive as inputs the outputs of the decoder circuitry. In the exemplary DRAM 10 of FIG. 1A, notice that the column decoders/drivers 20 are located in the middle of the device. When shown at higher magnification in FIG. 1B, it is seen that the driver circuits must drive certain signals all the way across the array 14 of cells, i.e., essentially half of the length across the expanse of the device. (Here, the term "array" is used to include the sense amplifiers and other I/O circuitry 30, such as is described in further detail in FIG. 1C, although an array can also comprise a continuous group of memory cells without such support circuitry). Specifically, column select lines 28, or CS lines or Y-select lines as they are sometimes called, are driven across the array 14 by column select driver circuits 20a, which can be viewed as part of the column decode/driver circuitry 20. As is known, the CS lines 28 are used to select a particular group of columns (bit lines) in the device, and thus can be viewed as column decoding lines.

The manner in which the CS lines 28 are used to select particular columns, or bit lines 35, in a DRAM is shown in FIG. 1C, which basically illustrates that a particular active (i.e., driven) CS line 28, can be used to enable particular I/O circuits 34 associated with the sense amps 32 at the end of the columns 35. Such selective activation of the I/O circuitry 334 by the CS lines 28 allows data to pass between the columns and the internal data path 40 of the device. In any event, it is not terribly important to an understanding of this disclosure how the CS line 28 functions to enable particular groups of columns.

What is important is recognition of a fact noted earlier: that the CS lines 28 have to transgress long distances over the integrated circuit. As one skilled in the art will appreciate, passing of signals over long signal lines is difficult. Such lines inherently have parasitic resistances and capacitances which impede the ability of the signal to propagate down the line, i.e., the signal will suffer from RC delays. As a result, the signal will travel more slowly than is ideal, and/or will be unable to achieve a desired voltage at a distance within a suitable period of time. In a worst case, and as applied to the exemplary DRAM of FIGS. 1A–1C, the CS line 28 signal will not reach the I/O circuitry 34 at various points along its length sufficiently quickly, and addressing of the cells may thus occur too slowly for proper device function.

Such RC delay problems are further exacerbated when it is considered that the CS lines 28 are logically routed through the middle of the array 14 as opposed to the peripheral areas of the integrated circuit outside of the array. Although it is known to employ various isolation schemes to try and reduce RC delays of such long-traveling signals, typical solutions are hampered by the busy nature of the signaling and the tight layout spacing in the array. Accordingly, a designer is limited in the options that can be employed to improve the signals propagation down such lines. For example, the designer cannot simply just make the lines wider in the array, or employ additional circuitry in the array (e.g., at the location of sense amp and I/O circuitry 30), as space may not be available to accommodate such modifications.

Hence, it is a goal of this disclosure to provide embodiments of a solution to the problem of degrading signal propagation along long signaling lines in integrated circuits, and specifically those passing through memory arrays.

SUMMARY

A method and circuitry for boosting a driven signal along a circuit line so as to reduce RC delays is disclosed. In one embodiment, the circuitry includes a line amplifier positioned at a distance from the circuitry that drives signals onto the line, for example, across a memory array. The line amplifier detects the driven signal on the line at early stages, and even before the signal reaches its full potential, the amplifier amplifies that signal and drives it back to the line to help boost the detected signal. In a preferred embodiment, the amplifier comprises a differential amplifier capable of boosting one of two input signal lines. In an alternative embodiment, the amplifier output may additionally input to a feedback loop, which loop ultimately drives a pull-up transistor to boost the detected signal and passes it back to the line to even further assist the differential amplifier in boosting. Use of the disclosed circuitry benefits, as one example, the boosting of a DRAM column select line that passes a long distance through the memory array.

BRIEF DESCRIPTION OF THE DRAWINGS

Embodiments of the inventive aspects of this disclosure will be best understood with reference to the following detailed description, when read in conjunction with the accompanying drawings, in which.

DETAILED DESCRIPTION

Figure 1A:
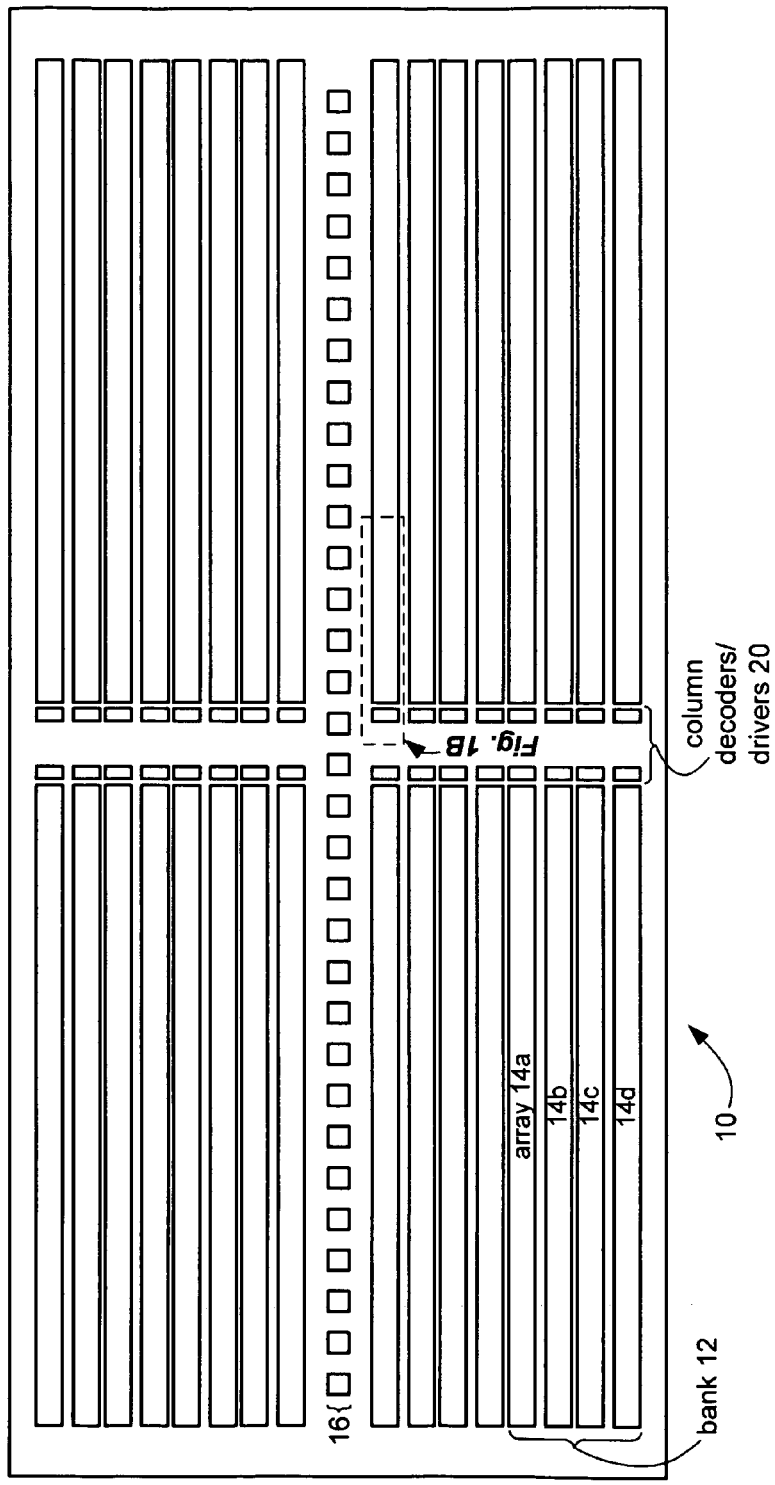
FIGS. 1A–1C illustrate the layout of a memory array, including column select lines and their drivers at the end of the array, and specifically shows the column select lines transgressing through the array in accordance with the prior art.
Figure 1B:
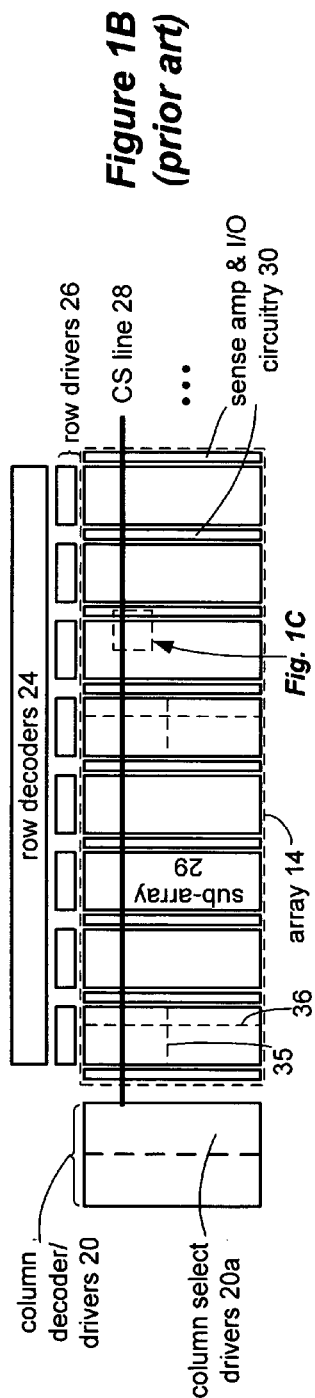
Figure 2A:
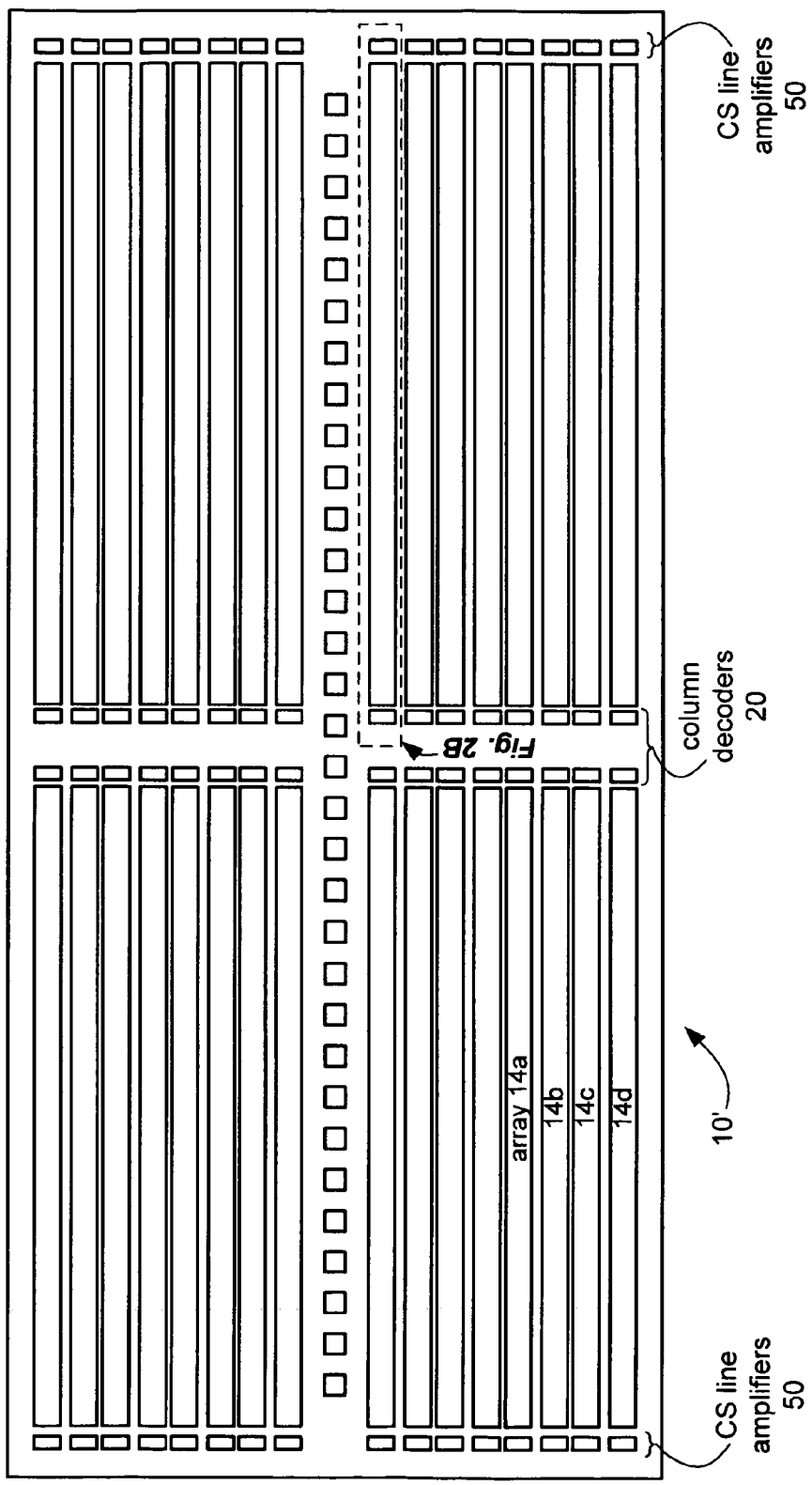
FIGS. 2A and 2B illustrate the addition of column select line amplifiers positioned at the opposite end of the array from the column select line drivers to assist in detecting and boosting the signals on the column select lines in accordance with an embodiment of the invention.
Figure 2B:
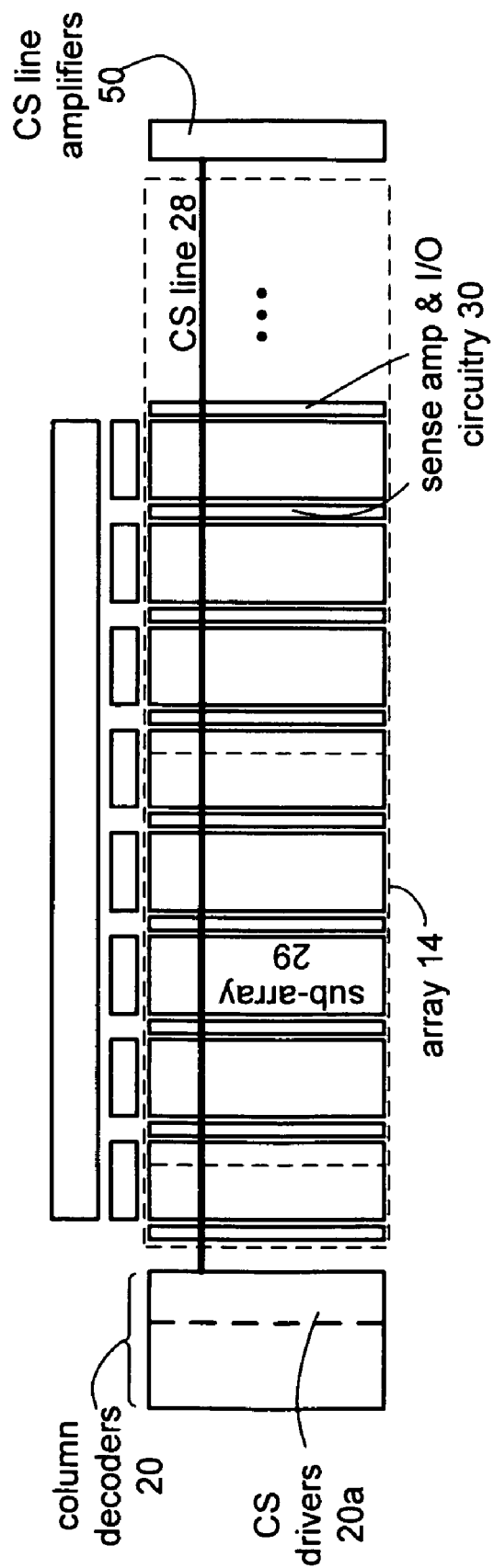

A solution to the problem of degrading signal propagation along long signaling lines, and specifically those passing through memory arrays, is shown in FIGS. 2A and 2B, which shows an improved DRAM circuit 10'. In contrast to FIGS. 1A and 1B of the prior art, and in accordance with one embodiment of the invention, additional circuitry has been added to the periphery of the device 10.' Specifically, column select (CS) line amplifiers 50 have been added to the opposite sides of the arrays 14 from the CS line drivers 20a to assist in signal propagation of the driven CS signals down the CS signal lines 28. As seen in FIG. 2B, the CS lines 28 are driven from the left side of the array 14 (in this instance, through the sub-array of cells 29 and the sense amplifier and I/O circuitry 30) to the CS line amplifiers 50 on the right side of the array.

Figure 1C:
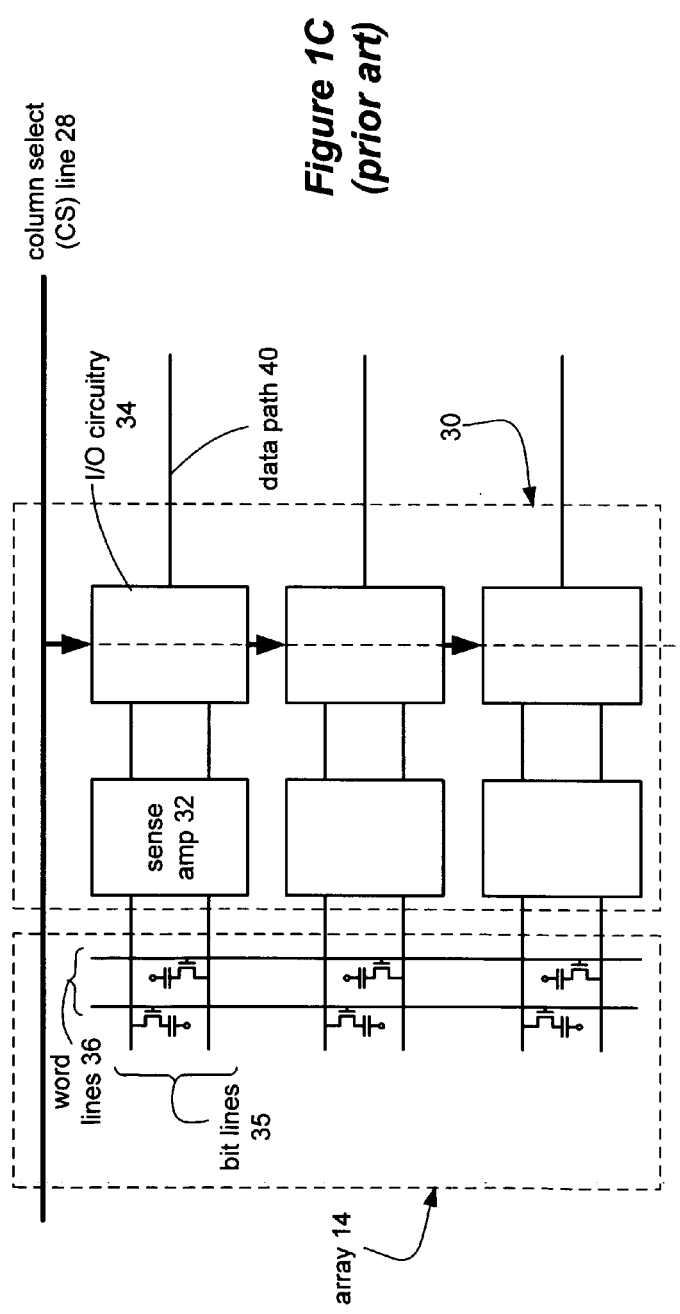

The purpose of the CS line amplifiers 50 is to detect the presence of a signal on a particular CS line 28 as it is being driven by the CS drivers 20a, and once detected, to assist in boosting the signal on the line 28. Such assisted boosting of the signals on CS lines 28 ultimately assists the signals in reaching the I/O circuits 34 at various points along the array 14 (see FIG. 1C). Therefore, with driving of the signal on one side of the array 14, and assisted boosting on the other side of the array, the CS line 28 will reach the various I/O circuits 34 more quickly, improving speed and reliability of memory cell access. For instance, simulations show that use of the disclosed circuitry 50 can help the CS signals 28 reach the far side of the array 14 (i.e., the right side in FIG. 2B) approximately 1.2 nanosecond faster. When it is appreciated that clock cycles internal to the device operate on this same order of nanoseconds, it is clear that use of the CS line amplifiers 50 constitutes a significant improvement in the device 10'.

Figure 3:
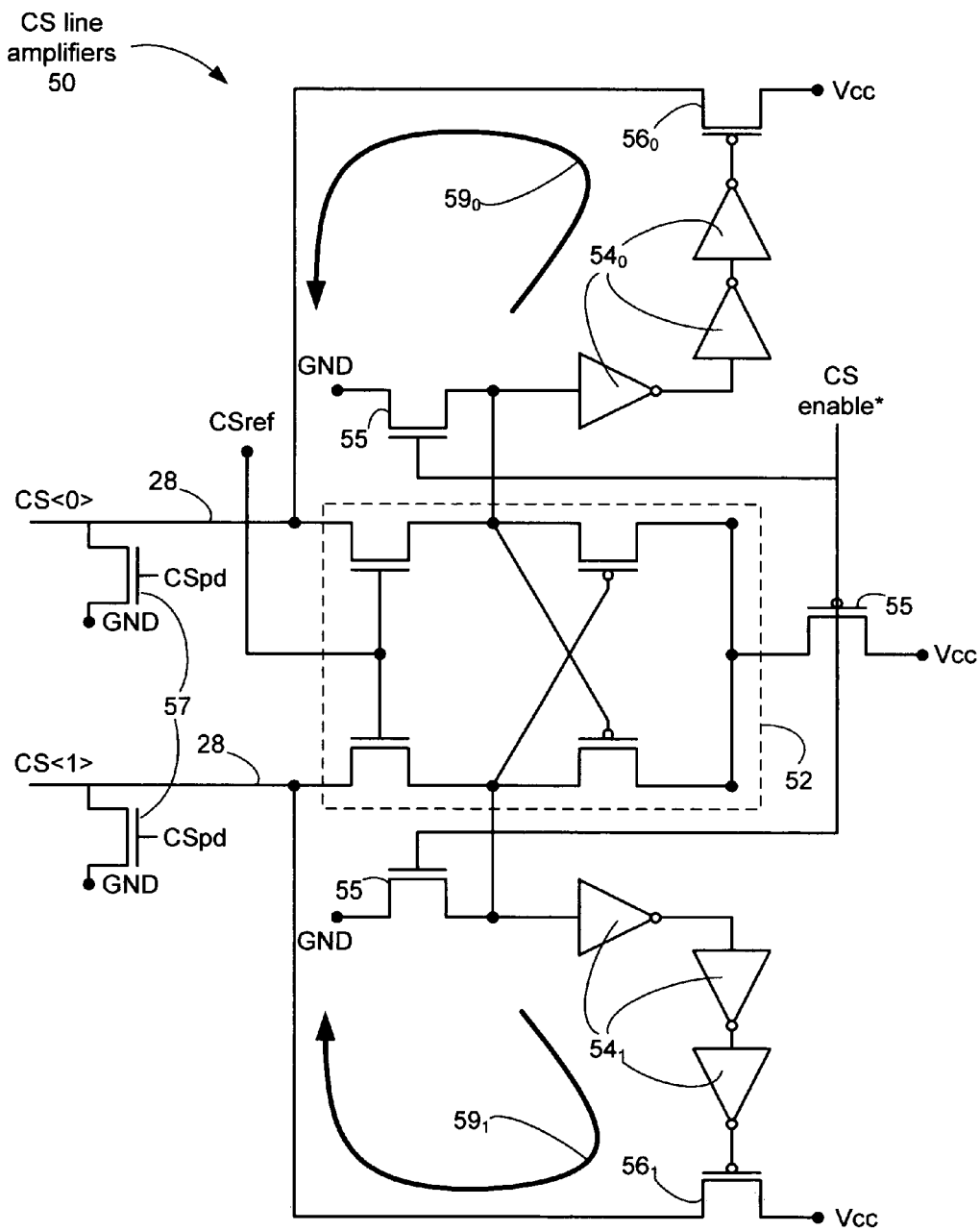
FIG. 3 illustrates exemplary circuitry for the column line select amplifiers of FIG. 3.

An embodiment of circuitry for the CS line amplifiers 50 as occurs at the periphery at the edge of a given array 14 is shown in FIG. 3. Because the preferred amplifier 52 within the line amplifier 50 is differential in nature, it receives two inputs, which for simplicity and efficiency are chosen as two adjacent CS lines 28, such as CS<0> and CS<1> as shown. The differential amplifier is comprised of a cross-coupled PMOS pair and a NMOS pass device with gate reference control. As is known, the differential amplifier 52 will compare the voltages present on the two inputs CS<0> and CS<1>, and will seek to amplify the difference. Thus, if CS<0> is slightly greater than CS<1>, evidencing that CS<0> is being driven by the drivers 20a on the other side of the array 14, the effect of the differential amplifier 52 will be to drive CS<0> towards Vcc (the power supply voltage). (Further amplification occurs by virtue of feedback loops 59, but this is ignored for now). Thus, the potential on the asserted CS line 28 (CS<0>) is accentuated, and its opposing non-asserted CS line 28 (CS<1>) is also affected. However, because the non-asserted CS line 28 (CS<1>) will not be asserted at the same time as the asserted CS line 28 (CS<0>), it does not matter that the voltage on the non-asserted line (CS<1>) is affected by the amplifier 52, as this occurs to no effect.

It is worth noting that while a differential amplifier 52 is preferred within the CS line amplifier 50, other non-differential (e.g., single input) amplifiers can be used as one skilled will understand, such as operational amplifiers, etc. However, because the differential amplifier 52 allows one amplifier to be used for two CS lines 28 without negative effect as just mentioned, it is preferred as a layout space-saving measure.

Other additional features of the preferred CS line amplifier circuit 50 include transistors 55 coupled to power (Vcc) and ground (GND), which allow the circuit 50 to be selectively enabled via an enable signal, CSenable* (active low). CSenable* thus allows the circuit 50 to be selectively activated when needed (i.e., during reading and writing of the cells in the array), and selectively disconnected from the power supplies when not needed to save power consumption in the device 10'. Another aspect of the circuit 50 includes the provision of a reference voltage, CSref, as an input to the differential amplifier 52. As one skilled in the art will appreciate, the value of this voltage is not critical, and can be approximately 700 mV for a device operating with a power supply (Vcc) on the order of 1.5V, for example. Additionally, pull down transistors 57 are preferably provided to ground both of the CS lines 28 via control signal CSpd, again when such lines are not used during reading and writing. As well as resetting the lines 28, such grounding allows the signals to be reliably set to a similar potential (i.e., allows the lines 28 to be equilibrated) so as not to confuse the differential amplifier 52 later during reading or writing. One skilled in the art will realize that other pull down or equilibration circuits can be used as well, and the choice of the pull down circuit used in the CS line amplifier 50 is not otherwise critical. While such additional features of the CS line amplifier 50 are preferred for the reasons mentioned, none are strictly necessary in other useful embodiments of the invention.

While the differential amplifier 52 can, depending on its design, provide the assisted boosting of the CS line 28 on its own, additional amplification preferably occurs via optional feedback loops 59. As shown in FIG. 3, the inputs of loops 59 are fed by the outputs of the differential amplifier 52. The loops 59 preferably comprise at least one inverter 54 (three are shown in series) which inputs into a pull-up P-channel transistor 56.

Once the differential amplifier 52 starts to amplify the differential voltage between the two CS lines 28, at some point the inverters 54 (i.e., the first inverter 54 if more than one are used in each loop) will detect the change in voltage. For example, if CS<0> is asserted, as the differential amplifier 52 raises the input voltage to the first inverter $54_0$, eventually that inverter will trip and output a low potential. (The relative widths of the P- and N-channel transistors in the inverters 54, not shown, can be tailored to set the trip point at an appropriate voltage). When this low potential is presented to the input of pull-up P-channel transistor $56_0$ (perhaps through some extra even number of inverters such as the two additional inverters shown), the potential will turn on that transistor $56_0$, thus routing Vcc through transistor $56_0$ and back to the CS<0> line 28, which was already in the process of being driven to Vcc via the drivers 20a on the other side of the array 14. Thus, loops 59 assist the differential amplifier 52 in the amplification of the signal on the CS lines 28. To so assist the amplifier 52 most effectively, the loops 59 are preferably relatively-large high-current devices. For example, the widths of the inverters 54 can be on the order of tens of units wide (compared to the minimum feature length), while the P-channel transistors 56 can be on the order of hundreds of units wide. However, other types of pull up circuits and devices could be used as well in place of P-channel pull up transistors $56_0$ and $56_1$.

Figure 4:
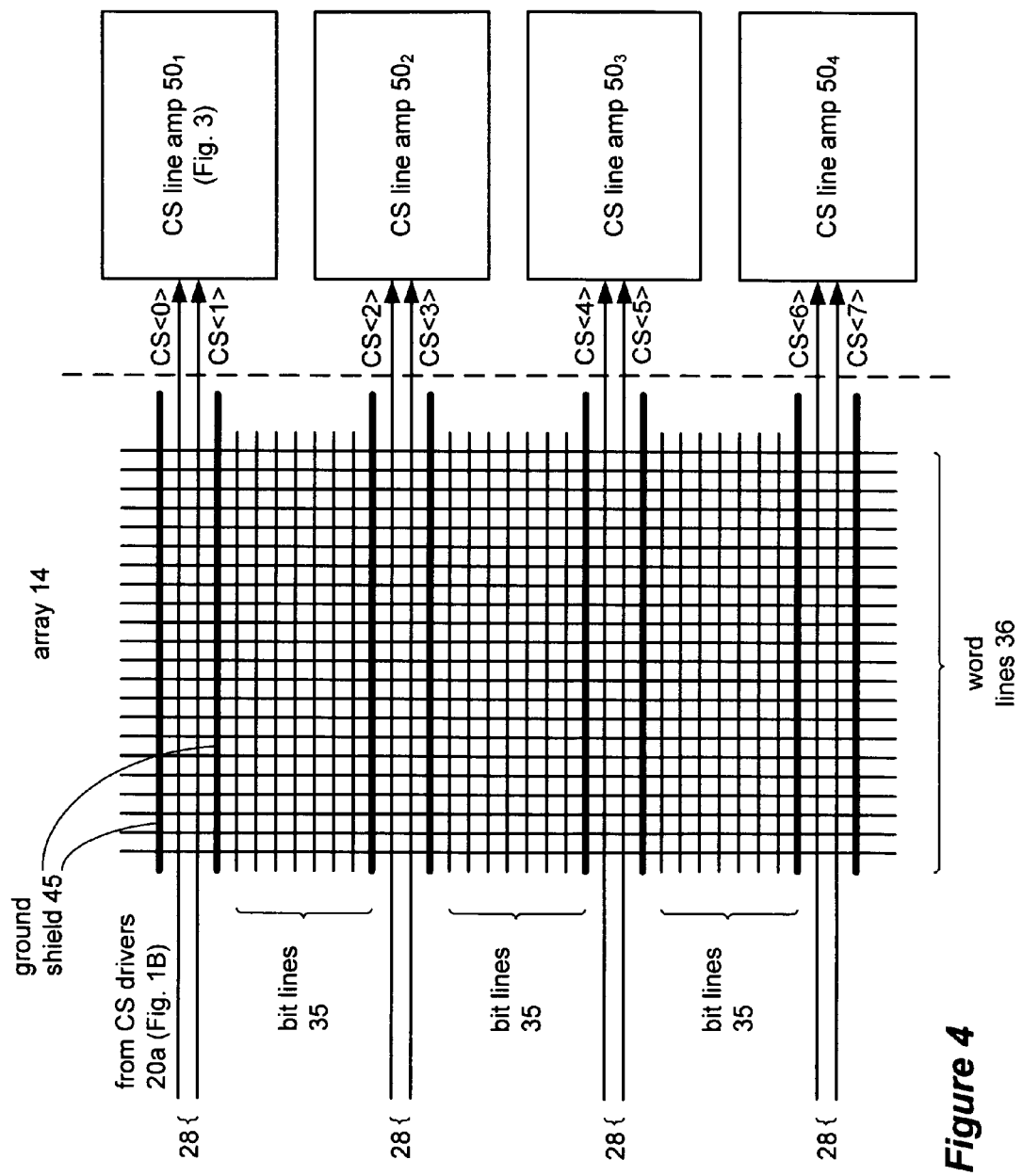
FIG. 4 illustrates the layout at the end of the array next to the column select line amplifiers of FIG. 3.

FIG. 4 shows the layout at the end of the array 14 near the layout of the CS line amplifiers 50. As shown, the CS lines are preferably bordered by ground shield 45 as they pass throughout the array 14 and the sense amp and I/O circuitry 30 (not shown for convenience). This helps to keep the CS lines 28 from being disturbed by the bit lines 35, even if the CS lines 28 and the bit lines 35 are formed at different conductive layers during processing.

While disclosed in the context of detecting/boosting a column select line transgressing a memory array, it should be noted that the disclosed amplifier circuitry 50 can be used to boost other signals traveling long distances, and can be used to boost signals that do not necessarily pass through arrays. Indeed, the disclosed invention can be used in any application in which a driven signal must pass a long distance along a line between its driver circuitry and another point along the line.

As used herein, "coupled" should not be understood as requiring a direct connection. Instead, two circuit elements can be said to be "coupled" in an electrical sense even if other structures intervene between the two elements.

It should be understood that the inventive concepts disclosed herein are capable of many modifications. To the extent such modifications fall within the scope of the appended claims and their equivalents, they are intended to be covered by this patent.

What is claimed is:

1. A method for boosting a signal along a signal line in an integrated circuit, comprising:
    driving the signal to a potential at a first end of the signal line via a driver circuit;
    detecting the signal at a second end of the signal line via an amplifier, the amplifier having an input and an output;
    boosting the detected signal on the line via the amplifier circuit; and
    further boosting the detected signal on the line via a feedback loop, wherein the feedback loop receives the output of the amplifier and passes a power supply voltage to the signal line.

2. The method of claim 1, wherein the amplifier comprises a differential amplifier.

3. The method of claim 2, wherein the differential amplifier comprises a cross-coupled PMOS pair and a NMOS pass device with gate reference control.

4. The method of claim 1, further comprising at least one inverter intervening between the amplifier output and the pull up input.

5. The method of claim 1, wherein the signal line comprises a column select line.

6. The method of claim 1, wherein the signal line transgresses a memory array.

7. The method of claim 1, wherein the pull up comprises a P-channel transistor.

8. A method for boosting a signal along a signal line in an integrated circuit memory device, comprising:
    driving the signal on the signal line to a potential at a first end of a memory array via a driver circuit, the signal line for enabling communication between bit lines in the memory array and a data path;
    detecting the signal on the signal line at a second end of the memory array via an amplifier, the amplifier having an input and an output; and
    boosting the detected signal on the signal line via the amplifier circuit.

9. The method of claim 8, further comprising further boosting the detected signal on the line via a feedback loop, wherein the feedback loop receives the output of the amplifier and passes a power supply voltage to the signal line.

10. The method of claim 8, wherein the amplifier comprises a differential amplifier.

11. The method of claim 10, wherein the differential amplifier comprises a cross-coupled PMOS pair and a NMOS pass device with gate reference control.

12. The method of claim 9, wherein the feedback loop comprises a pull up for passing a power supply voltage to the signal line.

13. The method of claim 8, wherein enabling communication between bit lines in the memory array and a data path comprises enabling a plurality of I/O circuits along the signal line.

14. Circuitry for driving a signal along a signal line in an integrated circuit, comprising:
    a signal line having a first end and a second end;
    a driver circuit coupled to the first end of the signal line for driving the signal on the signal line;
    an amplifier having an input and an output, the amplifier input coupled to the second end of the signal line, the amplifier for detecting the driven signal and for amplifying the signal on the line; and
    a pull up having an input, the pull up input coupled to the amplifier output, the pull up for passing a power supply voltage to the signal line when the amplifier amplifies the signal on the line.

15. The circuitry of claim 14, wherein the amplifier comprises a differential amplifier.

16. The circuitry of claim 15, wherein the differential amplifier comprises a cross-coupled PMOS pair and a NMOS pass device with gate reference control.

17. The circuitry of claim 14, further comprising at least one inverter intervening between the amplifier output and the pull up input.

18. The circuitry of claim 14, wherein the signal line comprises a column select line.

19. The circuitry of claim 14, wherein the signal line transgresses a memory array.

20. The circuitry of claim 14, wherein the pull up comprises a P-channel transistor.

21. Circuitry for driving a signal along a signal line in an integrated circuit, comprising:
    a signal line having a first end and a second end;
    a driver circuit coupled to the first end of the signal line for driving the signal on the signal line;
    an amplifier having an input and an output, the amplifier input coupled to the second end of the signal line, the amplifier for detecting the driven signal and for amplifying the signal on the line; and a feedback loop having an input, the feedback loop input coupled to the amplifier output, the feedback loop for further amplifying the signal on the signal line when the amplifier amplifies the signal on the line.

22. The circuitry of claim 21, wherein the amplifier comprises a differential amplifier.

23. The circuitry of claim 22, wherein the differential amplifier comprises a cross-coupled PMOS pair and a NMOS pass device with gate reference control.

24. The circuitry of claim 21, wherein the signal line comprises a column select line.

25. The circuitry of claim 21, wherein the signal line transgresses a memory array.

26. The circuitry of claim 21, wherein the feedback loop comprises a P-channel pull up transistor.

27. Circuitry for driving signals along first and second signal lines in an integrated circuit, comprising:
a first signal line and a second signal line;
a first driver circuit coupled to the first signal line for driving a first signal on the first signal line, and a second driver circuit for driving a second signal on the second signal line, wherein only one of the first and second signal lines are driven at a given time;
an amplifier having first and second inputs and first and second outputs, the first amplifier input coupled to the first signal line, the second amplifier input coupled to the second signal line, the amplifier for detecting the driven signal on either the first or second signal lines and for amplifying the signal on the driven signal line; and
first and second pull ups each having an input, the first pull up input coupled to the first amplifier output, the second pull up input coupled to the second amplifier output, the first and second pull ups for passing a power supply voltage respectively to either of the first and second signal lines when the amplifier amplifies the signal on the driven signal line.

28. The circuitry of claim 27, wherein the amplifier comprises a differential amplifier.

29. The circuitry of claim 28, wherein the differential amplifier comprises a cross-coupled PMOS pair and a NMOS pass device with gate reference control.

30. The circuitry of claim 27, further comprising at least one inverter intervening between the first amplifier output and the first pull up input, and at least one inverter intervening between the second amplifier output and the second pull up input.

31. The circuitry of claim 27, wherein the first and second signal lines comprise column select lines.

32. The circuitry of claim 27, wherein the first and second signal lines transgresses a memory array.

33. The circuitry of claim 27, wherein the pull up comprises a P-channel transistor.

34. Circuitry for driving signals along first and second signal lines in an integrated circuit, comprising:
a first signal line and a second signal line;
a first driver circuit coupled to the first signal line for driving a first signal on the first signal line, and a second driver circuit for driving a second signal on the second signal line, wherein only one of the first and second signal lines are driven at a given time;
an amplifier having first and second inputs and first and second outputs, the first amplifier input coupled to the first signal line, the second amplifier input coupled to the second signal line, the amplifier for detecting the driven signal on either the first or second signal lines and for amplifying the signal on the driven signal line; and
first and second feedback loops each having an input, the first feedback loop input coupled to the first amplifier output, the second feedback loop coupled to the second amplifier output, the first and second feedback loops for amplifying a signal on either of the first and second signal lines when the amplifier amplifies the signal on the driven signal line.

35. The circuitry of claim 34, wherein the amplifier comprises a differential amplifier.

36. The circuitry of claim 35, wherein the differential amplifier comprises a cross-coupled PMOS pair and a NMOS pass device with gate reference control.

37. The circuitry of claim 34, wherein the first and second signal lines comprise column select lines.

38. The circuitry of claim 34, wherein the first and second signal lines transgresses a memory array.

39. The circuitry of claim 34, wherein the first and second feedback loops comprise P-channel pull up transistors.

40. An integrated circuit memory device, comprising:
a signal line having a first end and a second end terminating at an end of a memory array, the signal line for enabling communication between bit lines in the memory array and a data path;
a driver circuit coupled to the first end of the signal line for driving the signal on the signal line; and
an amplifier having an input and an output, the amplifier input coupled to the second end of the signal line, the amplifier for detecting the driven signal and for amplifying the signal on the line.

41. The device of claim 40, further comprising a feedback loop having an input, the feedback loop input coupled to the amplifier output, the feedback loop for further amplifying the signal on the signal line when the amplifier amplifies the signal on the signal line.

42. The device of claim 41, wherein the feedback loop comprises pull up, and wherein further amplifying the signal comprises passing a power supply onto the signal line via the pull up.

43. The device of claim 40, wherein enabling communication between bit lines in the memory array and a data path comprises enabling a plurality of I/O circuits along the signal line.

44. The device of claim 40, wherein the amplifier comprises a differential amplifier.

45. The device of claim 44, wherein the differential amplifier comprises a cross-coupled PMOS pair and a NMOS pass device with gate reference control.

46. An integrated circuit memory device, comprising:
a first signal line and a second signal line each having a first end and a second end terminating at an end of a memory array, the first and second signal lines for enabling communication between bit lines in the memory array and a data path;
first and second driver circuits coupled respectively to the first ends of the first and second signal lines for driving the first and second signal lines, wherein only one of the first and second signal lines are driven at a given time; and
an amplifier having a two inputs and a two outputs, a first amplifier input coupled to the second end of the first signal line, a second amplifier input coupled to the second end of the second signal line, the amplifier for detecting the driven signal and for amplifying the signal on the driven signal line.

47. The device of claim 46, further comprising a first and second feedback loops each having an input, the first feedback loop input coupled to a first amplifier output, the second feedback loop input coupled to a second amplifier output, the first and second feedback loops for further amplifying the signal on either the first or second signal line when the amplifier amplifies the signal on the driven signal line.

48. The device of claim 47, wherein the first and second feedback loops comprises pull ups, and wherein further amplifying comprises passing a power supply onto the driven signal line via the pull up.

49. The device of claim 46, wherein enabling communication between bit lines in the memory array and a data path comprises enabling a plurality of I/O circuits along the signal line.

50. The device of claim 46, wherein the amplifier comprises a differential amplifier.

51. The device of claim 50, wherein the differential amplifier comprises a cross-coupled PMOS pair and a NMOS pass device with gate reference control.

* * * * *